(12) United States Patent
Oowaki

(10) Patent No.: US 6,510,071 B2
(45) Date of Patent: Jan. 21, 2003

(54) FERROELECTRIC MEMORY HAVING MEMORY CELL ARRAY ACCESSIBILITY SAFEGUARDS

(75) Inventor: Yukihito Oowaki, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/800,912

(22) Filed: Mar. 8, 2001

(65) Prior Publication Data

US 2001/0021120 A1 Sep. 13, 2001

(30) Foreign Application Priority Data

Mar. 8, 2000 (JP) .......................... 2000-063153

(51) Int. Cl.[7] .............................................. G11C 11/22
(52) U.S. Cl. .................. 365/145; 365/189.11; 365/200; 365/201; 365/227; 365/229
(58) Field of Search ............................ 365/145, 189.11, 365/200, 201, 227, 229, 129, 189.01

(56) References Cited

U.S. PATENT DOCUMENTS 5,270,967 A * 12/1993 Moazzami et al. ......... 365/145
5,463,588 A * 10/1995 Chonan ................. 365/189.09
5,477,176 A   12/1995 Chang et al.
5,764,562 A *  6/1998 Hamamoto ................. 365/149
5,881,012 A *  3/1999 Kawasaki et al. .......... 327/537
5,943,257 A *  8/1999 Jeon et al. .................. 365/145
5,963,467 A   10/1999 Miyatake et al.
6,134,174 A   10/2000 Takase

FOREIGN PATENT DOCUMENTS

EP   0 500 958 A1   8/1991
EP   0 709 851 A2   5/1996
JP   10-177785      6/1998

* cited by examiner

Primary Examiner—Hoai Ho
(74) Attorney, Agent, or Firm—Banner & Witcoff, Ltd.

(57) ABSTRACT

A ferroelectric memory has a memory cell array having memory cells arrayed and each constructed of a ferroelectric capacitor and a transistor, a decode circuit configured to select the memory cells of the memory cell array; a sense amplifier circuit configured to detect and amplify data of a selected memory cell of the memory cell array selected by the decode circuit; and an access permission circuit configured to output an access permission signal for permitting an access to said memory cell array when a predetermined period elapses after switching ON a power source or after reaching a predetermined internal state.

22 Claims, 9 Drawing Sheets

FERROELECTRIC MEMORY HAVING MEMORY CELL ARRAY ACCESSIBILITY SAFEGUARDS

CROSS REFERENCE TO RELATED APPLICATIONS

The subject application is related to subject matter disclosed in Japanese Patent Application No. 2000-63153 filed on Mar. 8, 2000 in Japan to which the subject application claims priority under Paris Convention and which is incorporated herein by reference.

BACKGROUND OF THE INVENTION

The present invention relates to a ferroelectric memory (hereinafter called FeRAM) in which to array memory cells each consisting of a ferroelectric capacitor and a transistor.

The FeRAM is capable of storing data in a non-volatile way by making use of a hysteresis characteristic of the ferroelectric capacitor, and is electrically rewritable.

An EEPROM (Electrically Erasable Programmable Read Only Memory) using non-volatile memory cells based on a stack gate structure is known as a semiconductor memory which can store data in non-volatile manner and is electrically rewritable. The FeRAM exhibits, however, advantages in which FeRAM has a larger number of rewritable processes, a shorter writing time, a lower voltage capable operation and lower consumption electric power than the EEPROM.

Other difference between the EEPROM and FeRAM exist in that in the EEPROM, the data reading operation is a non-destructive reading process, whereas in the FeRAM the data is read by a destructive reading process. In more detail, in the case of the FeRAM, when a voltage for reading is applied to the ferroelectric capacitor, one of pieces of data of "0" and "1" invariably involves an inversion of spontaneous polarization. Accordingly, after being read, there needs such a rewriting operation as to re-invert the inverted spontaneous polarization by the read data.

A discussion on the rewriting operation with reference to FIG. 4 will be made as follows. It is assumed that spontaneous polarizations Pr1, Pr2 each having the hysteresis characteristic of the ferroelectric capacitor are in a state where, for example, pieces of data "0" and "1" are stored. A positive voltage (e.g., a plate voltage) in FIG. 4 is applied to a ferroelectric capacitor, whereby a large quantity of signal electric charge occurs as indicated by a broken line with respect to the data "0", and, when the voltage is set back to the previous level, there becomes a "1" data state where the spontaneous polarization is inverted. Namely, the destructive reading takes place.

With respect to the data "1", since the signal electric charge quantity is small, and no polarization is not inverted. Thereafter, a negative voltage (e.g., a voltage supplied to a terminal electrode from a bit line) is applied to the ferroelectric capacitor, thereby rewriting the data "0" as indicted by the broken line.

In the FeRAM where the destructive reading described above is carried out, when read out in a state a internal voltage is not yet stabilized immediately after power on and when the voltage is applied to the ferroelectric capacitor, for instance, a correct value is not rewritten while the destructive reading is executed, and the data retained might be destructed.

In a DRAM, it is required in a specification or a standard that after switching on a power source, a pseudo access known as a dummy cycle must be carried out so as to wait till the voltage in each of the components of the memory falls within a range for an operation assurance.

In the case of the FeRAM, however, it is not enough that the dummy cycle is simply provided. Even when providing the dummy cycle, there exists a possibility in which the voltage is applied meanwhile to the ferroelectric capacitor that does not normally operate with the result that the data destruction occurs.

SUMMARY OF THE INVENTION

It is an object of the present invention, which was devised under such circumstances, to provide a ferroelectric memory capable of surely preventing a data destruction immediately after switching ON a power source and so on.

According to the one aspect of the present invention, there is provided a ferroelectric memory comprising:

a memory cell array having memory cells arrayed and each constructed of a ferroelectric capacitor and a transistor;

a decode circuit configured to select said memory cells of said memory cell array;

a sense amplifier circuit configured to detect and amplify data of a selected memory cell of said memory cell array selected by said decode circuit; and an access permission circuit configured to output an access permission signal for permitting an access to said memory cell array when a predetermined period elapses after switching ON a power source.

According to another aspect of the present invention, there is provided a ferroelectric memory comprising:

a memory cell array having memory cells arrayed and each constructed of a ferroelectric capacitor and a transistor;

a decode circuit configured to select said memory cells of said memory cell array;

a sense amplifier circuit configured to detect and amplify data of a selected memory cell of said memory cell array selected by said decode circuit; and an access permission circuit configured to output an access permission signal for permitting an access to said memory cell array after reaching a predetermined internal state.

The FeRAM according to the present invention is provided with an access permission circuit. The access permission circuit inhibits an access to a memory cell array during a period after switching on the power source. This contrivance makes it feasible to prevent a data destruction caused by applying a voltage in an unstable state to a ferroelectric capacitor.

According to the present invention, specifically, a counter for counting chip enable signals supplied from outside is provided. The access permission circuit detects that a count value of the counter reaches a predetermined value, and outputs the access permission signal. A chip internal state is thereby initialized to a normal state, and a dummy cycle for preventing the data destruction is set.

According to the present invention, the ferroelectric memory preferably has an internal power source circuit for generating an internal power source voltage by its being supplied with an external power source voltage, is provided. The access permission circuit detects that the internal power source voltage outputted by the internal power source circuit reaches a predetermined value, and outputs the access permission signal. It is therefore possible to prevent the data destruction caused by an operation in a state where the internal power source is unstable.

According to the present invention, the ferroelectric memory preferably comprises an internal power source circuit, having a function of switching a consumption current, for generating an internal power source voltage by the internal power source circuit being supplied with an external power source voltage. The internal power source circuit has a low consumption current during a standby state and is set, by the access permission signal outputted from the access permission circuit, in a state where the consumption current becomes larger than in the standby state. With this contrivance, the initialization of the internal voltage when switching ON the power source can be speeded up higher than before while restraining the consumption electric power when in the standby state, and a reliability when entering an active operation can be ensured.

According to the present invention, a specific mode of inhibiting the access is that at least one of the word line drive circuit and the plate line drive circuit is set in a drive signal output capable state by the access permission signal outputted from the access permission circuit. Alternatively, if a selective gate is provided between the memory cell array and the sense amplifier circuit, the selective gate drive circuit is activated by the access permission signal outputted from the access permission circuit. Further, an equalization circuit, activated when in a standby state, for equalizing a bit line of the memory cell array to a predetermined potential, is set inactive by the access permission signal outputted from the access permission circuit. The data destruction can be prevented by a proper combination of these modes.

Further, according to the present invention, a test area accessible irrespective of whether or not the access permission signal is given from the access permission circuit, is set in the memory cell array, and the access permission circuit judges a coincidence of test write data to the test area with read data therefrom, and outputs the access permission signal. With this contrivance, the accessibility can be obtained by confirming a voltage stable state with no data destruction.

DESCRIPTION OF THE PREFERRED EMBODIMENTS

Embodiments of the present invention will hereinafter be described with reference to the accompanying drawings.

[Embodiment 1]

Figure 1:
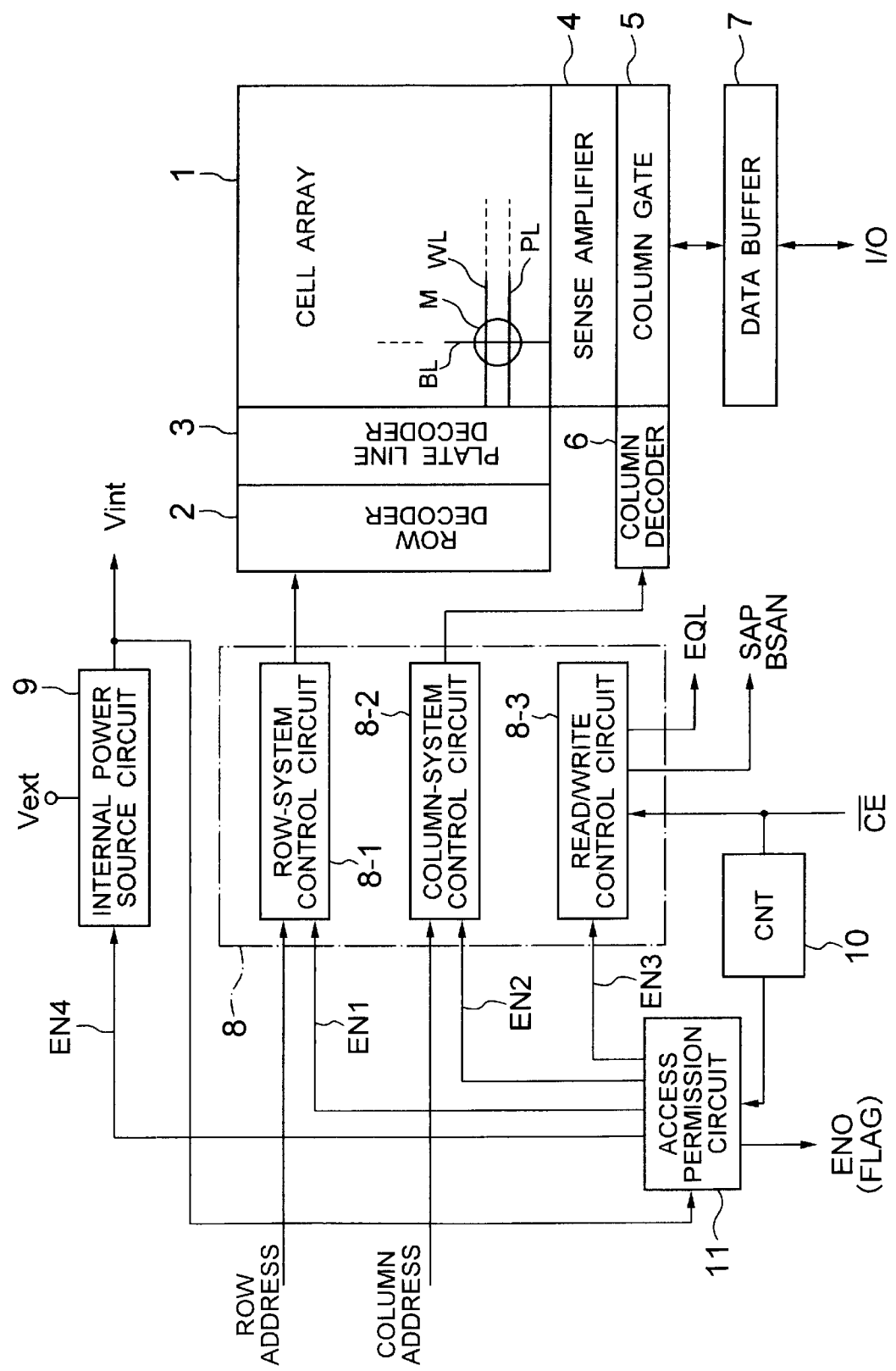
FIG. 1 is a block diagram showing a construction of an FeRAM according to the first embodiment of the present invention.

FIG. 1 shows a block diagram of a FeRAM according to the first embodiment 1. A memory cell array 1 is configured by memory cells M each constructed of a ferroelectric capacitor and a transistor are arrayed. The memory cell M is disposed at each intersection of a word line WL, a plate line PL and a bit line BL. A row decoder 2 selectively drives the word line WL of this memory cell array 1, while a plate line decoder 3 selectively drives the plate line PL.

Figure 2:
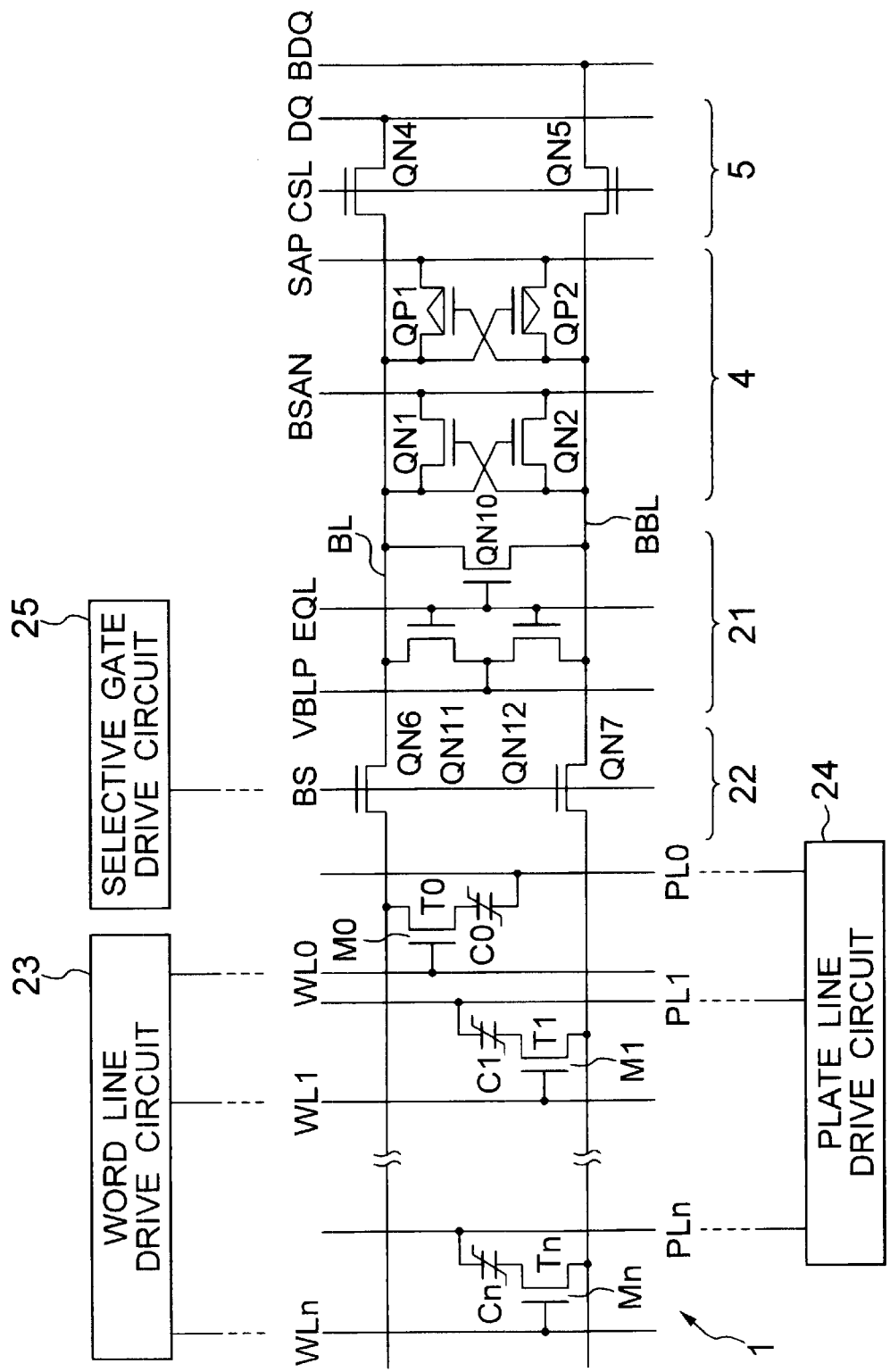
FIG. 2 is a diagram showing a configuration of a memory cell array in the same embodiment.

The memory cell array 1 is configured as in FIG. 2 if shown with respect to one bit line pair BL, BBL. Herein, there is shown an example of a 1-transistor/1-capacitor configuration in which the memory cell Mi (i=0 through n) is constructed of one transistor Ti and one ferroelectric capacitor Ci. A gate of the transistor Ti is connected to the word line WLi, and a terminal (plate electrode) of the ferroelectric capacitor Ci is connected to the plate line PLi.

The row decoder 2 includes a word line drive circuit 23 for driving the word line WLi. The bit lines BL, BBL are separated by NMOS transistors QN6, QN7 which are selective gates 22 in a region between an interior of the cell array and a sense amplifier circuit 4. These selective gates 22 may be a block selective gate in the case of, e.g., a series connected TC unit type ferroelectric RAM which consists of series connected memory cells each having a transistor having a source terminal and a drain terminal and a ferroelectric capacitor in between the two terminals, or a selective gate for switching a connection of a shared sense amplifier. If the selective gate 22 is the block selective gate, a selective gate drive circuit 25 for driving this gate 22 is, for instance, selectively activated by a block decoder contained in a row-system control circuit 8-1.

A bit line equalizing circuit 21 and a bit line sense amplifier circuit 4 are provided on the bit lines BL, BBL outside the selective gate 22. The equalizing circuit 21 includes an equalization NMOS transistor QN10 for short-circuiting between the bit lines BL, BBL, and precharge NMOS transistors QN11, QN12 of which one terminals are connected to the bit lines BL, BBL, respectively. Gates of these transistors are controlled in common by equalizing signals EQL. The sense amplifier circuit 4 consists of a NMOS flip-flop constructed of NMOS transistors QN1, QN2, and a PMOS flip-flop constructed of PMOS transistors QP1, QP2.

The bit lines BL, BBL are respectively connected to data lines DQ, BDQ via NMOS transistors QN4, QN5 which form a column gate 5. The column gate 5 is controlled by a column decoder 6.

Read-out data is outputted to an I/O terminal via a data buffer 7. Further, write data inputted from the I/O terminal is transferred via the data buffer 7 to the sense amplifier circuit 4 of a column selected by the column gate 5. Then, the write data is written to a selective memory cell of the memory cell array 1.

A control circuit 8 for executing read/write control of the memory cell array 1 includes a row-system control circuit 8-1, a column-system control circuit 8-2 and a read/write control circuit 8-3. The row-system control circuit 8-1 takes in a row address, and controls the row decoder 2 and the plate line decoder 3. The column-system control circuit 8-2 takes in a column address and controls the column decoder 6. The read-write control circuit 8-3 generates a bit line equalization signal EQL, sense amplifier activation signals SAP, BSAN, etc.

An internal power source circuit 9 for generating an internal power source voltage Vint by its being supplied with an external power source voltage Vext, is provided inside the memory chip. This internal power source circuit 9 may also be what includes a boost circuit for generating a boost voltage as the necessity may arise.

A chip enable signal /CE supplied from outside the chip sets the memory chip in an active state. To be specific, normally, the external power source is switched ON, and the chip enable signal /CE becomes "L", whereby the control circuit 8 attains a memory cell array accessible state.

In the embodiment 1, however, even when the chip enable signal /CE becomes "L" with power-on, an immediate access to the memory cell array 1 does not start.

More specifically, in the embodiment 1, a counter 10 for counting rises of the chip enable signal /CE is provided, and there is also provided an access permission circuit 11 for detecting that a count value of the counter 10 comes to a certain predetermined value, and generating access permission signals EN (EN0 through EN4). This access permission circuit 11 sets a predetermined allowance period after switching ON the power source, wherein the accessibility to the memory cell array 1 is not obtained until this allowance period elapses.

The access permission circuit 11 also monitors the internal power source voltage Vint outputted by the internal power source circuit 9. The access permission circuit 11 thereby outputs the access permission signal EN when the internal power source voltage Vint reaches a certain predetermined level. To be more specific, a judgement of the access permission circuit 11 about the count value of the counter 10 and a judgement thereof about the internal power source voltage Vint, may be set as AND conditions for generating the access permission signals EN, or any one these judgements may also be used.

In the embodiment shown in FIG. 1, examples of the access permission signals EN are the signal EN1 entering the row-system control circuit 8-1, the signal EN2 entering the column-system control circuit 8-2, the signal EN3 entering the read/write control circuit 8-3, the signal EN4 entering the internal power source circuit 9, and the signal EN0 outputted outside as a flag. These signals EN0–EN4 may be structured as one signal or may be separate signals with timings slightly deviating from each other corresponding to a control target circuit.

Figure 3:
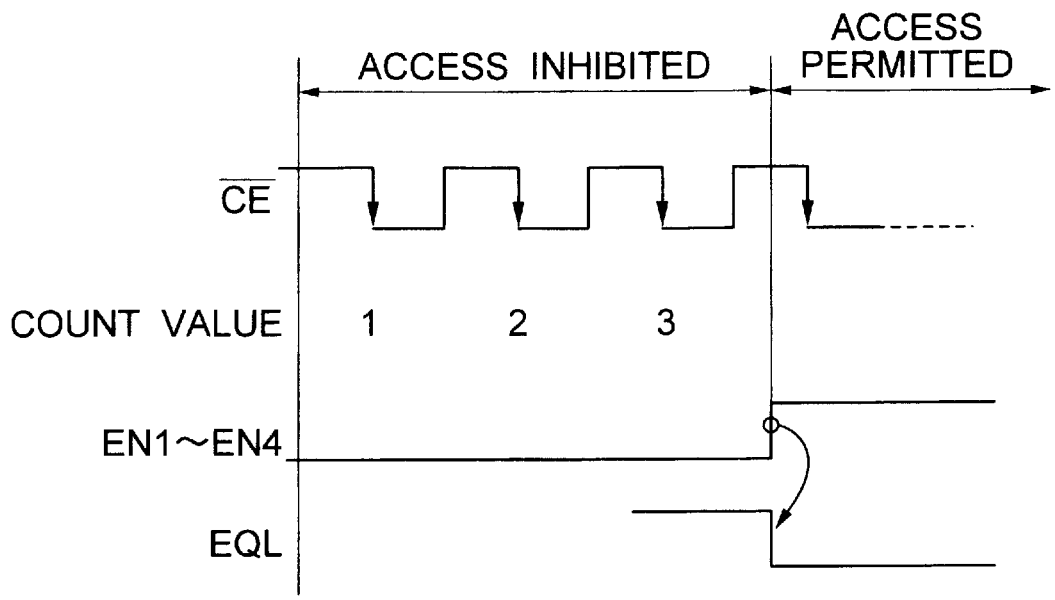
FIG. 3 is a timing chart showing an access permission signal in the same embodiment.
Figure 4:
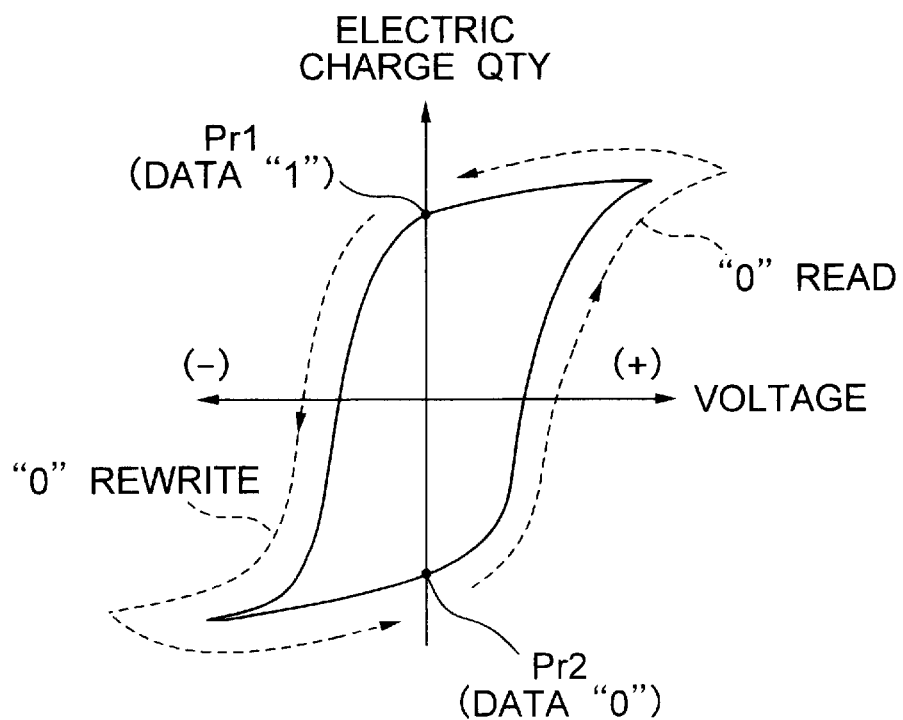
FIG. 4 is a graph showing a hysteresis characteristic of a ferroelectric capacitor in the same embodiment.

FIG. 3 shows how the access permission circuit 11 generates the access permission signal EN after the counter 10 has counted three rises of the chip enable signal /CE. As shown in FIG. 3, it is preferable that the access permission signal EN be generated during an "H" state of the chip enable signal /CE. The control circuit thereby detects a fall of the chip enable signal /CE after the access permission signal EN has come to "H", and can enter the active operation. As a specific condition for generating the access permission signal, an arbitrary count value of 1 or larger may be selected.

FIG. 3 also shows that the access permission signal EN sets the equalization signal EQL in the "L" state, i.e., an equalizing operation of the equalization circuit 21 is canceled.

The followings are specific control modes of the control circuits 8-1, 8-2, 8-3 involving the use of the access permission signals EN. The row-system control circuit 8-1, till informed of the access permission signal EN="H", keeps inactive the row decoder 2 for driving the word line WL and the plate line decoder 3 for driving the plate line PL. Specifically, under the access permission signal EN based control, the row-system control circuit 801 keeps inactive the output-stage gate for outputting an activation signal.

The plate line PL is not thereby driven during a period when accessing is inhibited. Accordingly, the voltage is not applied to the ferroelectric capacitor, and a data destruction is prevented. Further, the word line is not driven during this period of time, and hence noises occur on the plate line, and an electric potential rises. Even in such a case, a cell node electrode facing to a plate electrode of the ferroelectric capacitor fluctuates synchronizing with the noises on the plate line. Accordingly, the voltage applied t the ferroelectric capacitor is restrained smaller than the noises on the plate line. For example, a noise voltage applied to the ferroelectric capacitor is restrained such as multiplication of Vnoise by Cpara/Ccell, where Ccell is a capacitance of the ferroelectric capacitor, Cpara is a parasitic capacitance of the cell node electrode, and Vnoise is a potential fluctuation of the plate line. The word line is driven, and the transistor is switched ON, in which case when considering that the voltage of Vnoise is applied to the ferroelectric capacitor at the worst, there is obtained an effect that the data destruction is prevented in a state where the power source is unstable.

Further, the column-system control circuit 8-2 keeps the column decoder 6 inactive during the access-inhibited period for which the access permission signal EN is "L". The read/write control circuit 8- keeps the equalization signal EQL at "H" (active) during the access-inhibited period, and also keeps the bit line at a precharge potential VBLP (0V in this case). The read/write control circuit 8-3 also keeps the sense amplifier activation signals SAP, BSAN inactive. The plate line potential and the bit line potential are thereby kept at the same potential. Therefore, even if the word line is mistakenly driven or if there is a leak in the word line, the voltage is not applied to the ferroelectric capacitor, and the data destruction is prevented.

Further, any one of the row-system control circuit 8-1 and the column-system control circuit 8-2 includes a decoder for selecting a line connection to the shared sense amplifier circuit of the memory cell array 1, and the activation of this decoder is triggered likewise by the access permission signal EN="H". The selective drive circuit 25 is thereby kept inactive during the access-inhibited period for which the access permission signal EN is "L". In this case, even when the potential fluctuates in the areas of the sense amplifier circuit 4, the equalization circuit 21 outside the block selective gate of the memory cell array 1 and so on, the potential fluctuation is not transferred to the memory cell, and the data destruction is still prevented.

Note that it is not necessarily required to perform all the controls such as inhibiting the plate line, the word line and the selective gate from being driven during the access-inhibited period and keeping the equalization circuit active. If at least any one of the plate line and the word line is kept OFF, the voltage applied to both of the terminals of the ferroelectric capacitor is small, and the data destruction can be prevented. If the selective gate between the sense amplifier circuit and the bit line is kept OFF during the access-inhibited period, or if the plate line and the word line are inhibited from being driven, there is no problem because of having no direct influence upon the cell array even when the equalization is canceled. Accordingly, by operating peripheral circuits in synchronism with the chip access signal, normal internal state for enabling normal access can be maintained.

In the embodiment 1, further, the internal power source circuit 9 is kept active during the "L" state of the access permission signal EN4 and kept in a state of a low electric consumption. With this contrivance, he internal power source reaches the predetermined potential soon when becoming accessible, and a reliability of the first access can be enhanced. Further, a time for enabling the first access to be done can be decreased without increasing a standby current.

Figure 5:
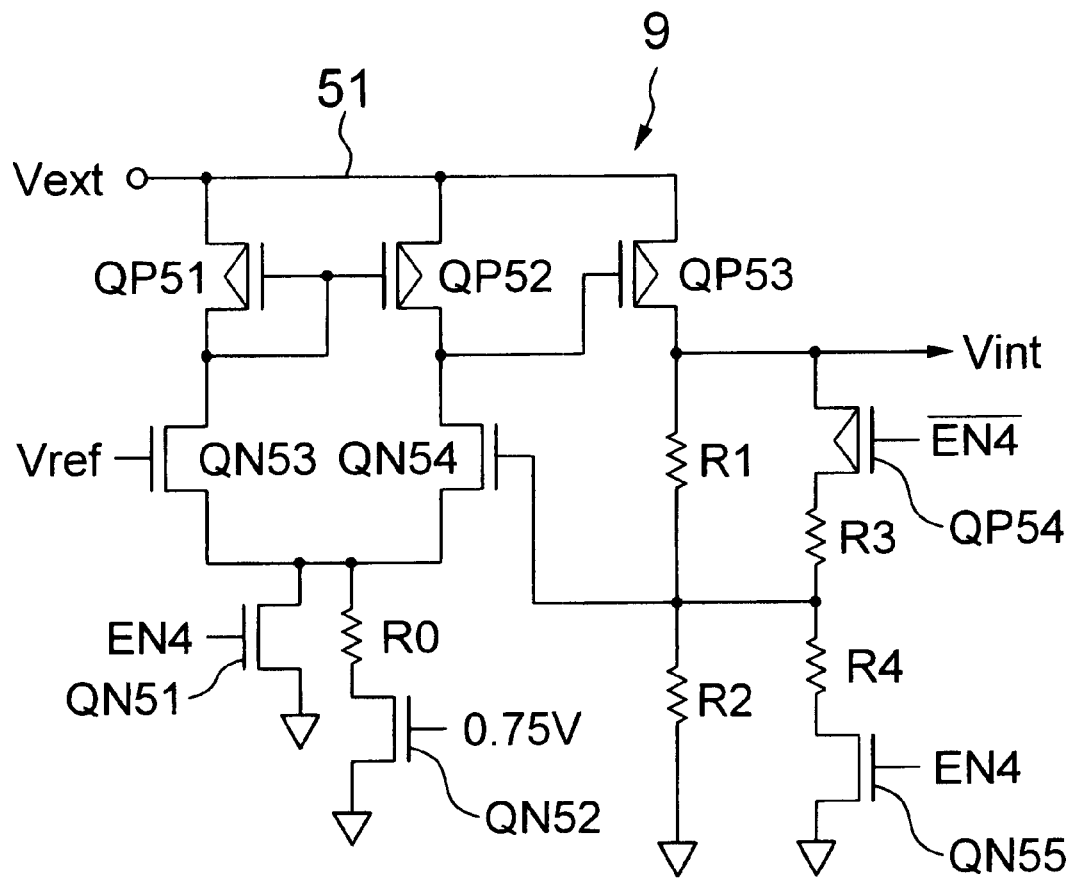
FIG. 5 is a circuit diagram showing a construction of an internal power source circuit in the same embodiment.

FIG. 5 shows a specific example of configuration of the internal power circuit 9 constructed so that the consumption current is switched when in standby and when active. A reference current source connected to a common source of differential transistors QN53, QN54 of a current mirror type differential circuit 51, is prepared diverting to two systems such as a route of the NMOS transistor QN51 and a route of the NMOS transistor QN52 with a resistor R0 being interposed herein.

An output stage of the power source consists of a load circuit and a PMOS transistor QP53 of which a gate is controlled by an output of the differential circuit 51. The load circuit has two systems, i.e., one system of resistors R1, R2 and another system of resistors R3, R4. The resistors R1, R2 are both as high as, e.g., 10 MΩ or thereabouts. Both of the resistors R4, R5 are as low as approximately 100 kΩ, and a PMOS transistor QP54 and an NMOS transistor QN55, which are controlled respectively by the access permission signals /EN4, EN4, are inserted in this system. Connection nodes of these resistors R1, R2 and connection nodes of the resistors R3, R4 are feedback-connected to the gate of the NMOS transistor QN54 of the differential circuit 51, thereby stabilizing the output.

In this internal power source circuit 9, the reference current source of the differential circuit 51 is switched ON only on the side of the NMOS transistor QN52 driven by a small gate voltage, and the consumption current value is restrained small in the standby state. The access permission signal EN4 becomes "H", whereby the NMOS transistor QN51 is switched ON and the consumption current value increases. When the consumption current value increases, a response speed can be increased. With respect to the output stage also, in the standby state, the load occurs on the route of the resistors R1, R2, and the low current state is held. Then, when the access permission signal EN4 becomes "H", the resistors R3, R4 become the load, resulting in a large current consumption state.

As discussed above, the consumption current of the internal power source circuit 9 is switched to the access-inhibited period and the access time thereafter, whereby the consumption electric power is restrained during the standby state and the internal potential reaches the desired value at a higher speed when switching ON the power source, i.e., during the access-inhibited period than in the standby state. Therefore, the reliability of the first access is enhanced.

Further, according to the configuration shown in FIG. 1, the access permission signal EN0 is outputted outside as the flag. This makes it feasible to notify the system that the access is inhibited because the internal power source potential does not yet reach the predetermined value. In this case, the access permission signal EN0 may be directly outputted outside or may be read in the form of a single bit or code from other shared pin by a proper procedure such as using a command etc.

[Embodiment 2]

Figure 6:
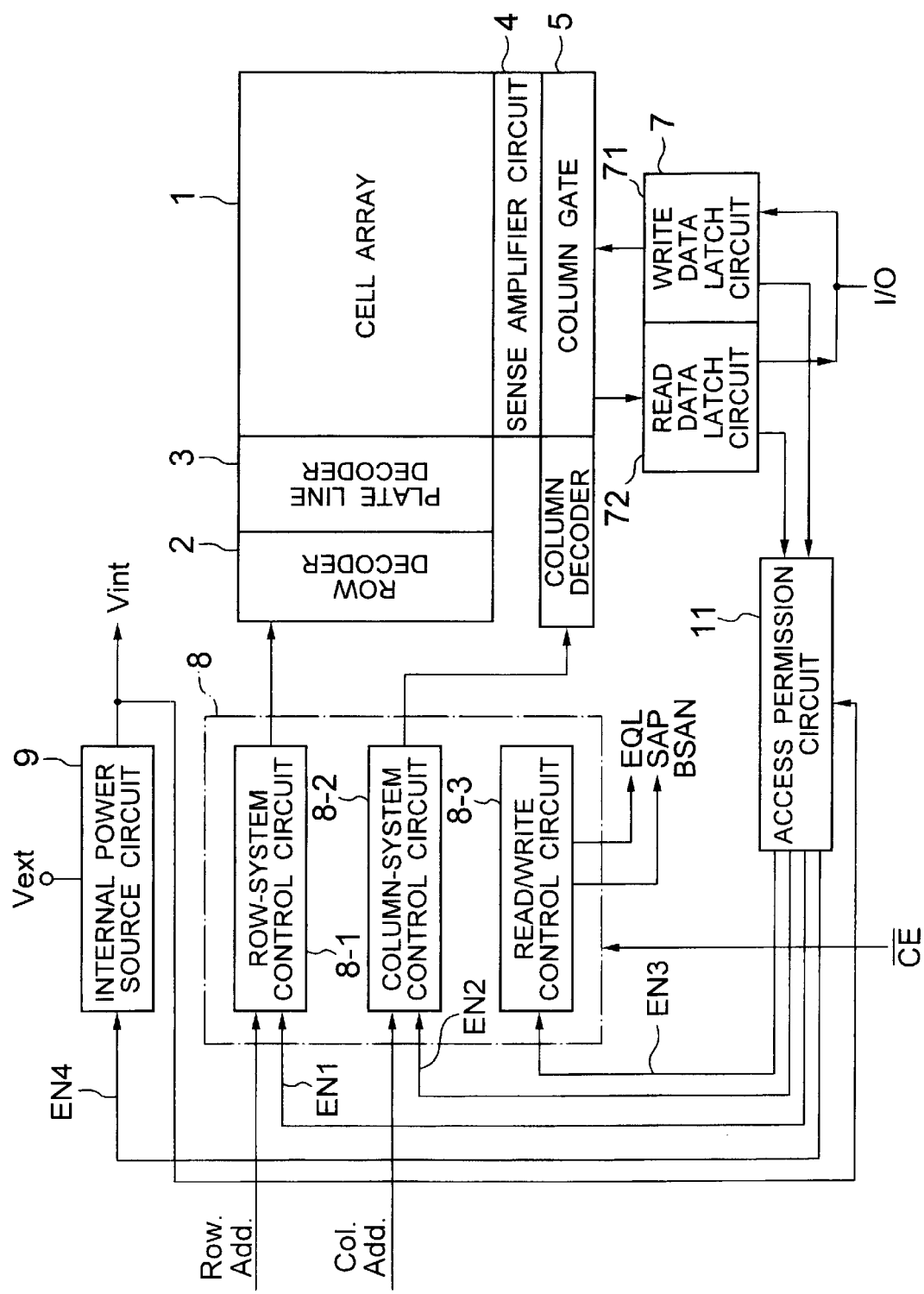
FIG. 6 is a block diagram showing a construction of the FeRAM according to the second embodiment of the present invention.
Figure 7:
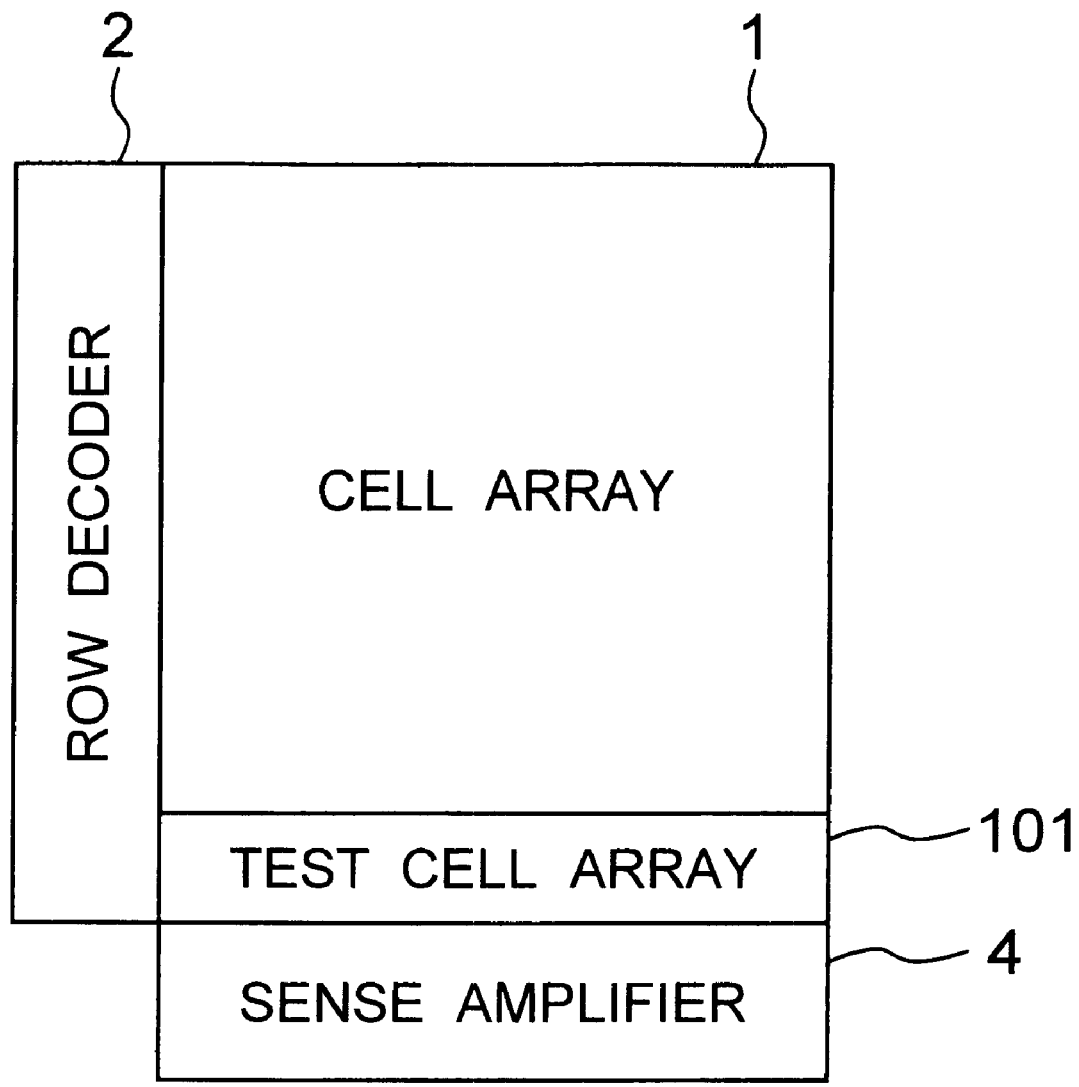
FIG. 7 is a diagram showing a configuration of the memory cell array in the same embodiment.

FIG. 6 is a block diagram of the FeRAM in an embodiment 2. The basic architecture of the FeRAM is the same as what is shown in FIG. 1, and the components corresponding to those in FIG. 1 are marked with the same numerals as those in FIG. 1. In accordance with the embodiment 2, as shown in FIG. 7, a test cell array (which will hereinafter simply called test area) 101 accessible irrespective of whether or not the access permission signal is given from the access permission circuit 11 and selected by, e.g., a specified row address, is set in the memory cell array 1. The test area 101 is defined as an area which the test data can be written to and read from, and may also be a redundancy cell area to which an address can not be allocated by a normal operation.

In the case of the embodiment 2, the access permission circuit 11 judges a coincidence of the test write data to the test area 101 with the read data obtained by reading the written data, and outputs the access permission signal EN.

Specifically, as shown in FIG. 6, the data buffer 7 is provided with a write data latch circuit 71 for latching onto the write data, and a read data latch circuit 72 for latching onto the read data. When performing a preparatory test, the data are preparatorily written to and read from a restricted row address area corresponding to the test area 101, wherein the accessing is not inhibited by the access permission circuit 11. Then, the access permission circuit 11 detects a coincidence of the data retained by the write data latch circuit 71 with the data retained by the read data latch circuit 72, and outputs the access permission signal EN.

Namely, in the case of the embodiment 2, the access permission circuit 11 has a function of changing an accessible width, and executes the control of switching the accessible width by comparing the write data to the narrow address space with the read data.

The embodiment 2 is also capable of preventing the data destruction by inhibiting the access to the area where the data destruction should absolutely be avoided after switching ON the power source, and of permitting the access after the data read and write are assured.

In the embodiment 2, the read/write data at the test are preferably composed of a plurality of bits. A reliability of the judgement about the permission of accessing can be thereby enhanced.

Note that the access restriction and the data comparison are made on-chip, however, these functions may not be provided on the ship but may be prepared on the system side. This arrangement leads to a decrease in cost for the FeRAM chip. If the access restriction such as specifying the address and so on is made on the system side, however, it is only when the address etc given to the chip is correctly interpreted to attain that function. Therefore, as in the embodiment discussed above, the reliability is by far more enhanced when applying the access restriction on the on-chip basis.

Figure 8:
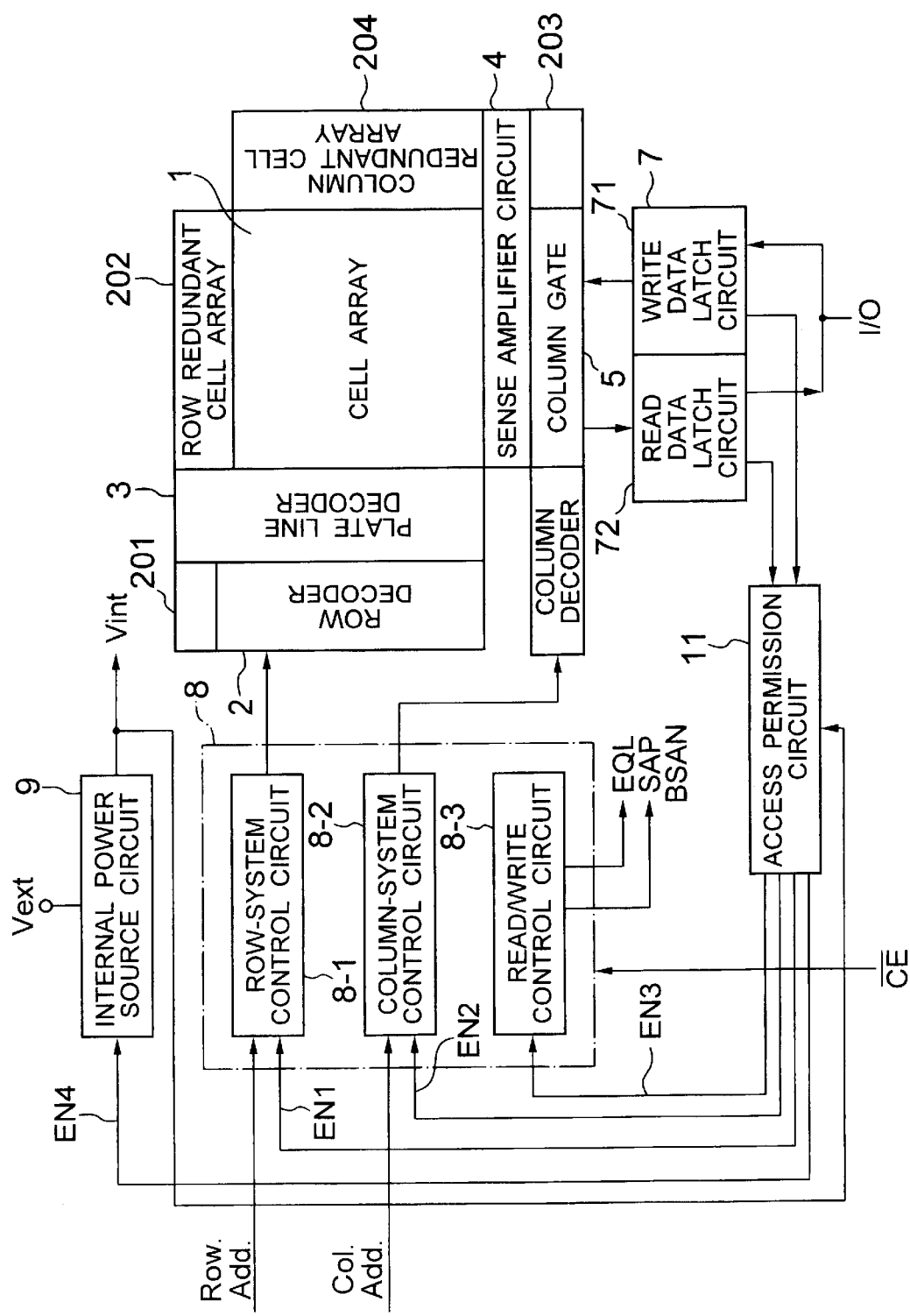
FIG. 8 is a block diagram showing a variation of the FeRAM shown in FIG. 6.

FIG. 8 shows an FeRAM which is a variation of that shown in FIG. 6. A row redundancy cell array and a column redundancy cell array are provided next to the cell array. In order to access these redundancy cell arrays, a redundancy row decoder and a redundancy column decoder are provided in order to access the redundancy cells. Such redundancy cell arrays can be used as test areas as mentioned before.

Figure 9:
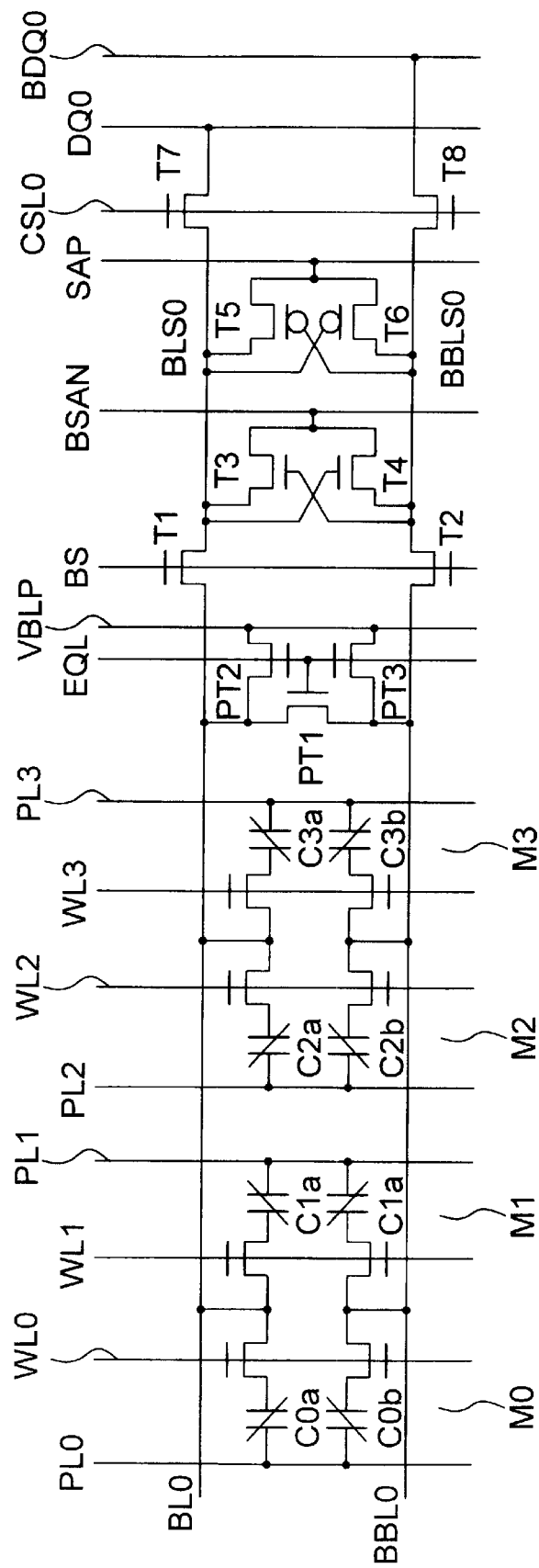
FIG. 9 is a diagram showing a construction of other memory cell array to which the present invention is applied.
Figure 10:
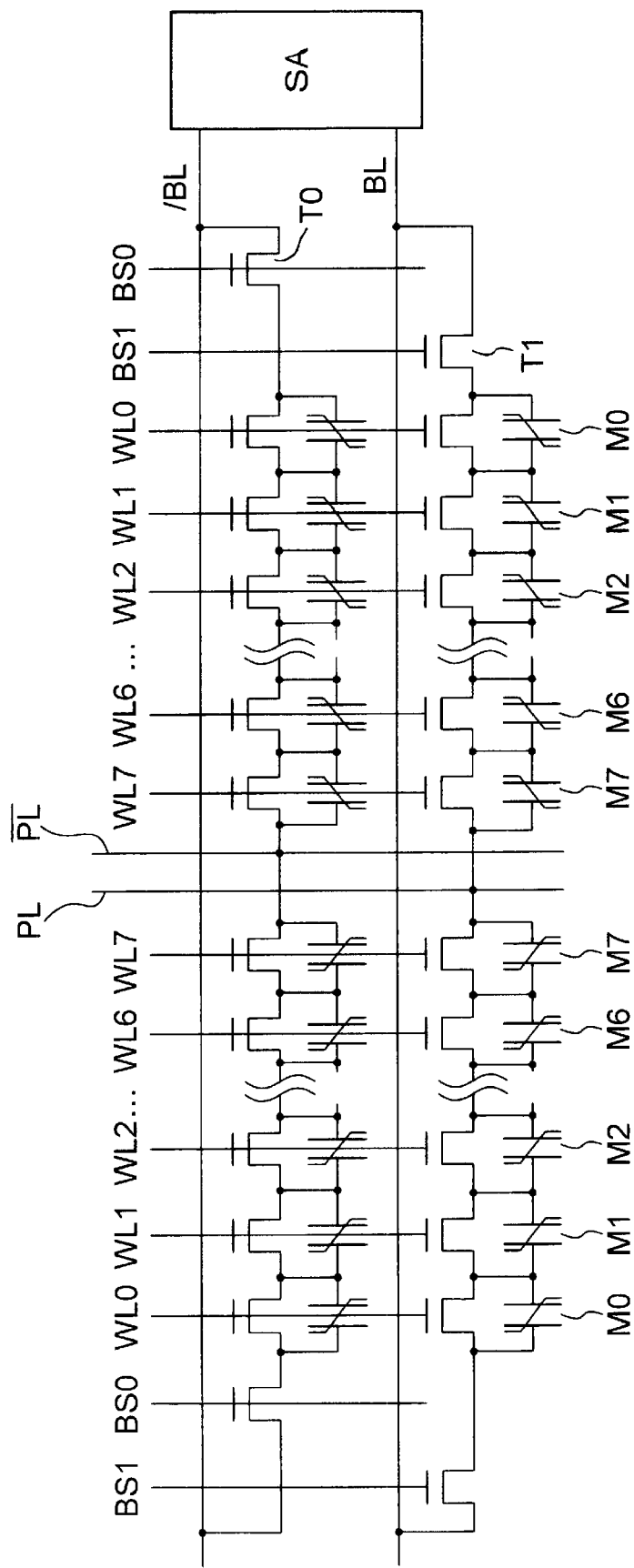
FIG. 10 is a diagram showing a construction of still other memory cell array to which the present invention is applied.

The embodiment has been discussed so far concentrating on the FeRAM having the 1-transistor/1-capacitor memory cell structure. The present invention is not, however, limited to this FeRAM. For example, as shown in FIG. 9, the present invention can be applied to an FeRAM wherein memory cell M for making 1-bit storage is constructed of two transistors and two capacitors. Further, as shown in FIG. 10, the present invention can be applied to a series connected TC unit type ferroelectric RAM including a plurality of memory cells M, for example eight pieces in FIG. 10, each memory cell having one transistor and one capacitor. In this type FeRAM, all the word lines WL are set in "H" in the standby state, and there is kept a state where both terminals of the ferroelectric capacitor are short-circuited, and the data are read and written with the selected word line being set in "L". accordingly, the control by he access permission circuit 11 should meet at least one of the following conditions:

(1) there is kept the standby state where all the word lines are "H" till the access permission signal EN becomes "H";
(2) the plate line is not driven; and
(3) the block selective line is not driven ON.

In the FeRAM provided with the access permission circuit according to the present invention, as described above, the access permission circuit inhibits the access to the memory cell array after switching ON the power source or during the allowance period, thereby making it possible to prevent the data destruction due to applying the voltage in the unstable state to the ferroelectric capacitor.

What is claimed is:

1. A ferroelectric memory, comprising:
   a memory cell array having memory cells arrayed and each constructed of a ferroelectric capacitor and a transistor;
   a decode circuit configured to select said memory cells of said memory cell array;
   a sense amplifier circuit configured to detect and amplify data of a selected memory cell of said memory cell array selected by said decode circuit; and
   an access permission circuit configured to output an access permission signal to inhibit an access to said memory cell array before a predetermined period elapses after switching ON a power source.

2. The ferroelectric memory according to claim 1, further comprising a counter configured to count chip enable signals supplied from outside,
   wherein said access permission circuit detects that a count value of said counter reaches a predetermined value, and permits an access to said memory cell array.

3. The ferroelectric memory according to claim 1, further comprising an internal power source circuit, having a function of switching a consumption current, for generating an internal power source voltage by said internal power source circuit being supplied with an external power source voltage,
   wherein said internal power source circuit has a low consumption current during a standby state and is set in a state where the consumption current becomes larger than in the standby state after the predetermined period.

4. The ferroelectric memory according to claim 1, wherein said decode circuit includes a word line drive circuit configured to selectively drive the word line connected to a gate of the transistor of said memory cell, and a plate line drive circuit for driving a plate line connected to one terminal of said ferroelectric capacitor of said memory cell, and
   at least one of said word line drive circuit and said plate line drive circuit is set in a drive signal output capable state after the predetermined period.

5. The ferroelectric memory according to claim 1, wherein said decode circuit includes a selective gate drive circuit configured to drive a selective gate for connecting said memory cell array to said sense amplifier circuit, and
   said selective gate drive circuit is activated after the predetermined period.

6. The ferroelectric memory according to claim 5, further comprising an equalization circuit, configured to equalize a bit line of said memory cell array to a predetermined potential in the predetermined period.

7. The ferroelectric memory according to claim 1, further comprising an equalization circuit, configured to equalize a bit line of said memory cell array to a predetermined potential in the predetermined period.

8. The ferroelectric memory according to claim 1, wherein a test area accessible irrespective of whether or not the access permission signal is given from said access permission circuit, is set in said memory cell array, and
   said access permission circuit judges a coincidence of test write data to the test area with read data therefrom, and permits an access to said memory cell array.

9. The ferroelectric memory according to claim 8, wherein said test area is a redundancy circuit which has not been replaced for normal cell.

10. The ferroelectric memory according to claim 8, further comprising a write data latch circuit for latching onto test data written to the test area of said memory cell array, and a read data latch circuit for latching onto read data obtained by reading the data written to the test area of said memory cell array, and
    said access permission circuit, when comparing the data retained by said write data latch circuit with the data retained by said read data latch circuit and detecting a coincidence therebetween, permits an access to said memory cell array.

11. The ferroelectric memory according to claim 1, further comprising an internal power source circuit for generating an internal power source voltage by said internal power source circuit being supplied with an external power source voltage,
    wherein said access permission circuit detects that the internal power source voltage outputted by said internal power source circuit reaches a predetermined value, and permits an access to said memory cell array.

12. The ferroelectric memory according to claim 1, wherein said sense amplifier is deactivated during the predetermined period.

13. A ferroelectric memory, comprising:
    a memory cell array having memory cells arrayed and each constructed of a ferroelectric capacitor and a transistor;
    a decode circuit configured to select said memory cells of said memory cell array;
    a sense amplifier circuit configured to detect and amplify data of a selected memory cell of said mernory cell array selected by said decode circuit; and
    an access permission circuit configured to output an access permission signal to inhibit an access to said memory cell array before reaching a predetermined internal state after switching ON a power source.

14. The ferroelectric memory according to claim 13, further comprising an internal power source circuit for generating an internal power source voltage by said internal power source circuit being supplied with an external power source voltage,
    wherein said access permission circuit detects that the internal power source voltage outputted by said internal power source circuit reaches a predetermined value, and permits an access to said memory cell array.

15. The ferroelectric memory according to claim 13, further comprising an internal power source circuit, having a function of switching a consumption current, for generating an internal power source voltage by said internal power source circuit being supplied with an external power source voltage, wherein said internal power source circuit has a low consumption current during a standby state and is set in a state where the consumption current becomes larger than in the standby state after the predetermined internal state has been reached.

16. The ferroelectric memory according to claim 3, wherein said decode circuit includes a word line drive circuit configured to selectively drive the word line connected to a gate of the transistor of said memory cell, and a plate line drive circuit for driving a plate line connected to one terminal of said ferroelectric capacitor of said memory cell, and at least one of said word line drive circuit and said plate line drive circuit is set in a drive signal output capable state after the predetermined internal state has been reached.

17. The ferroelectric memory according to claim 13, wherein said decode circuit includes a selective gate drive circuit configured to drive a selective gate for connecting said memory cell array to said sense amplifier circuit, and said selective gate drive circuit is activated by the access permission signal outputted from said access permission circuit.

18. The ferroelectric memory according to claim 13, further comprising an equalization circuit, configured to equalize a bit line of said memory cell array to a predetermined potential, and said equalization circuit to equalize said bit line to the predetermined potential until said equalization circuit reaches a predetermined internal state.

19. The ferroelectric memory according to claim 13, further comprising an equalization circuit, configured to equalize a bit line of said memory cell array to a predetermined potential, and said equalization circuit to equalize said bit line to the predetermined potential until said equalization circuit reaches a predetermined internal state.

20. The ferroelectric memory according to claim 3, wherein a test area accessible irrespective of whether or not the access permission signal is given from said access permission circuit, is set in said memory cell array, and said access permission circuit judges a coincidence of test write data to the test area with read data therefrom, and after the predetermined internal state has been reached.

21. The ferroelectric memory according to claim 20, wherein said test area is a redundancy circuit which has not been replaced for a normal cell.

22. The ferroelectric memory according to claim 21, further comprising a write data latch circuit for latching onto test data written to the test area of said memory cell array, and a read data latch circuit for latching onto read data obtained by reading the data written to the test area of said memory cell array, and said access permission circuit, when comparing the data retained by said write data latch circuit with the data retained by said read data latch circuit and detecting a coincidence therebetween, permits an access to said memory cell array.

* * * * *